(12) United States Patent
Cho et al.

(10) Patent No.: US 6,656,286 B2
(45) Date of Patent: Dec. 2, 2003

(54) PEDESTAL WITH A THERMALLY CONTROLLED PLATEN

(75) Inventors: Thomas K. Cho, Palo Alto, CA (US); Tetsuya Ishikawa, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 294 days.

(21) Appl. No.: 09/776,002

(22) Filed: Feb. 2, 2001

(65) Prior Publication Data

US 2001/0004880 A1 Jun. 28, 2001

Related U.S. Application Data

(63) Continuation of application No. 09/349,412, filed on Jul. 7, 1999.

(51) Int. Cl.[7] .............................. H01L 21/00; C23C 16/00
(52) U.S. Cl. ........................ 118/728; 118/725; 118/500; 156/915; 156/345.51; 156/345.52
(58) Field of Search .................................. 118/715–730; 156/345.52, 345.51, 915

(56) References Cited

U.S. PATENT DOCUMENTS

| | | | | |
|---|---|---|---|---|
| 4,432,635 A | | 2/1984 | Mayer | 355/30 |
| 5,343,938 A | * | 9/1994 | Schmidt | 165/80.2 |
| 5,474,612 A | | 12/1995 | Sato et al. | 118/715 |
| 5,558,717 A | | 9/1996 | Zhao et al. | 118/715 |
| 5,584,936 A | | 12/1996 | Pickering et al. | 118/728 |
| 5,667,622 A | | 9/1997 | Hasegawa et al. | 156/345 |
| 5,688,331 A | | 11/1997 | Aruga et al. | 118/725 |
| 5,737,923 A | * | 4/1998 | Gilley et al. | 62/3.7 |
| 5,740,016 A | | 4/1998 | Dhindsa | 361/704 |
| 5,802,856 A | | 9/1998 | Schaper et al. | 62/3.7 |
| 5,996,353 A | | 12/1999 | Maxwell et al. | 62/3.2 |
| 6,032,724 A | | 3/2000 | Hatta | 165/80.2 |
| 6,066,836 A | | 5/2000 | Chen et al. | 219/390 |
| 6,074,488 A | * | 6/2000 | Roderick et al. | 118/728 |
| 6,084,215 A | | 7/2000 | Furuya et al. | 219/444.1 |
| 6,160,244 A | | 12/2000 | Ohashi | 219/444.1 |
| 6,301,434 B1 | * | 10/2001 | McDiarmid et al. | 392/416 |

FOREIGN PATENT DOCUMENTS

JP 07254498 A * 10/1995 ............ H05H/1/46

OTHER PUBLICATIONS

Cho et al. "Pedestal with a Thermally Controlled Platen" U.S. patent application Ser. No. 09/349,412, filed Jul. 7, 1999.

* cited by examiner

*Primary Examiner*—Gregory Mills
*Assistant Examiner*—Ram N Kackar
(74) *Attorney, Agent, or Firm*—Moser, Patterson & Sheridan (57) ABSTRACT

A workpiece support having dichotomy of thermal paths therethrough is provided for controlling the temperature of a workpiece support thereon. In one embodiment, a workpiece support includes a platen body having a plug centrally disposed in a workpiece support surface of the platen body. A lower surface of the plug defines a void between the plug and a bottom of the bore. The void creates a dichotomy of thermal paths through the platen body thus controlling the temperature of a wafer support surface. Alternatively, the plug and platen body may be fabricated from materials having different rates of thermal conductivity to created the dichotomy of thermal paths in addition to or in absence of the void.

23 Claims, 6 Drawing Sheets

PEDESTAL WITH A THERMALLY CONTROLLED PLATEN

This application is a continuation of co-pending U.S. patent application Ser. No. 09/349,412, filed Jul. 7, 1999, which is hereby incorporated by reference in its entirety.

BACKGROUND OF THE DISCLOSURE

1. Field of Invention

The present invention relates generally to a semiconductor wafer processing apparatus. More specifically, the invention relates to an apparatus for providing a controllable, uniform temperature distribution across the diameter of a semiconductor wafer.

2. Background of the Invention

In semiconductor wafer processing, the surface temperature of the wafer is a critical process parameter. Changes in, and gradients across the wafer surface during wafer processing are detrimental to material deposition, etch rate, feature taper angles, step coverage and the like. It is essential to have control over local temperature uniformity during wafer processing to enhance processing and minimize undesirable characteristics.

A number of devices have been used in the art to control wafer temperature during processing. One method feeds a chilled fluid through a wafer support pedestal during wafer processing. The fluid removes heat from the wafer support pedestal thus cooling the wafer. This method of cooling the wafer has two inherent problems. First, the response times required to bring a wafer to a desired temperature is relatively long. As such, rapid dynamic control of the water temperature to compensate for rapid wafer temperature fluctuations is not possible. Consequently, the wafer is not maintained as a constant temperature. Typically, the response times are limited to approximately 2 minutes per degree.

A second disadvantage of this method is the inability to control the temperature uniformity across the surface of the wafer. Heat transfer from the wafer to the wafer support pedestal is generally greatest in the center of the wafer and less towards the edges. Since the fluid temperature is generally uniform inside the wafer support pedestal, the wafer cools more rapidly in the center. This causes a temperature gradient across the wafer surface, becoming more severe with increased diameter wafers, e.g., 300 mm. This temperature gradient is one of the primary causes of feature variation in semiconductor wafer processing.

Another method of controlling wafer temperature that provides rapid dynamic control of the pedestal temperature uses thermo-electric devices embedded in the pedestal surface that supports the wafer (i.e., the support surface). These devices are oriented in a planar array below the support surface of the pedestal. However, within such an array, temperature gradients form between the individual devices, i.e., each device effectively transfers heat at its location while a lesser amount of heat is transferred at the locations immediately adjacent to and between the devices. Such gradients between a plurality of devices cause substantial temperature variation across the wafer, i.e., hot and cold locations are formed. Consequently, process variations may occur across the wafer in response to the temperature variations.

Therefore, there is a need in the art for an apparatus which can maintain a wafer at a predetermined temperature and provide a uniform temperature across the wafer support surface of a wafer support pedestal.

SUMMARY OF INVENTION

A workpiece support for controlling the temperature of a workpiece is provided. In one aspect of the invention, a workpiece support includes a platen body having a plug centrally disposed in a workpiece support surface of the platen body. A lower surface of the plug defines a void between the plug and a bottom of the bore. The void creates a dichotomy of thermal paths through the platen body thus controlling the temperature of a wafer support surface.

In another embodiment, a workpiece support includes a platen body having a plug centrally disposed in a workpiece support surface of the platen body wherein the platen body and plug have different rates of thermal conductivity.

In another aspect of the invention, a processing system is provided. In one embodiment, a processing system includes a process chamber, a showerhead centrally disposed beneath a lid of the process chamber, a gas supply connected to the lid of the process chamber and a platen disposed within said process chamber. The process chamber includes walls having internal passages that are fluidly connected to a coolant reservoir. The platen includes a platen body having a plug centrally disposed in a workpiece support surface of the platen body. A lower surface of the plug defined a void between the plug and a bottom of the bore. The void creates a dichotomy of thermal paths through the platen body thus controlling the temperature of a wafer support surface.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

Figure 1:
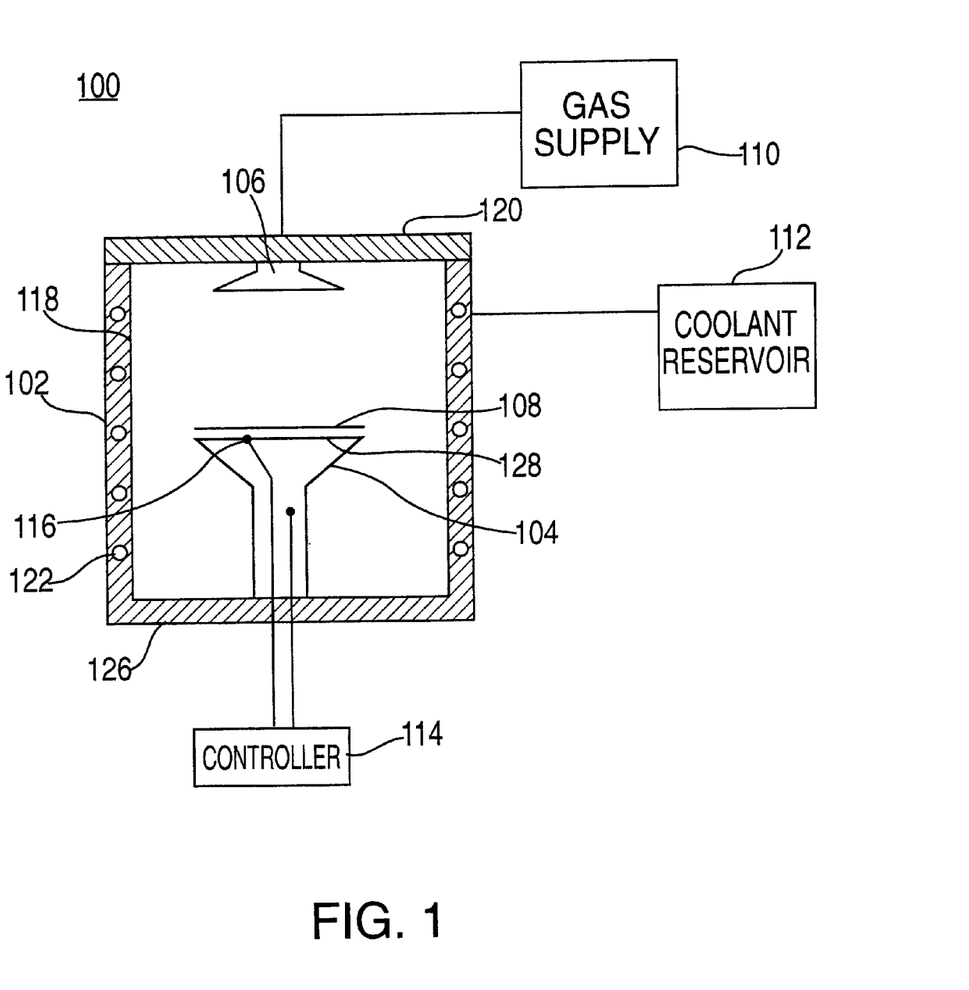
FIG. 1 is a cross-sectional schematic view of a semiconductor wafer processing system.

FIG. 1 depicts a cross-sectional schematic view of a semiconductor wafer processing system 100. The depicted system is, for example, a chemical vapor deposition (CVD) system. However, such a system is merely illustrative of the invention's usefulness in any wafer processing system requiring that the wafer be maintained at a uniform temperature. The system 100 contains a process chamber 102, a pedestal assembly 104, a showerhead 106, a gas supply 110, a coolant reservoir 112, and a controller 114. The process chamber 102 has a base 126, wall 118 and a lid 120. A coolant (e.g., facility's water) circulates between the reservoir 112 and the chamber 102, flowing through passages 122 in the wall 118. The pedestal assembly 104 is disposed within the process chamber 102 and centered beneath the showerhead 106. The showerhead 106 provides a disbursive entry conduit for reactive and other gases to enter the chamber 102 from the gas supply 110. The pedestal assembly 104 contains a sensor 116 (thermocouple or thermally active resistor) which provides the controller 114 with temperature information measured proximate a wafer support surface 128 of the pedestal assembly 104. Such temperature information is indicative of the wafer temperature. The controller 114 provides a signal to a thermo-electrical device (discussed below) located within the pedestal assembly 104 such that the heat transfer characteristics of the thermo-electrical device can be dynamically controlled to effect control of the wafer temperature.

Figure 2:
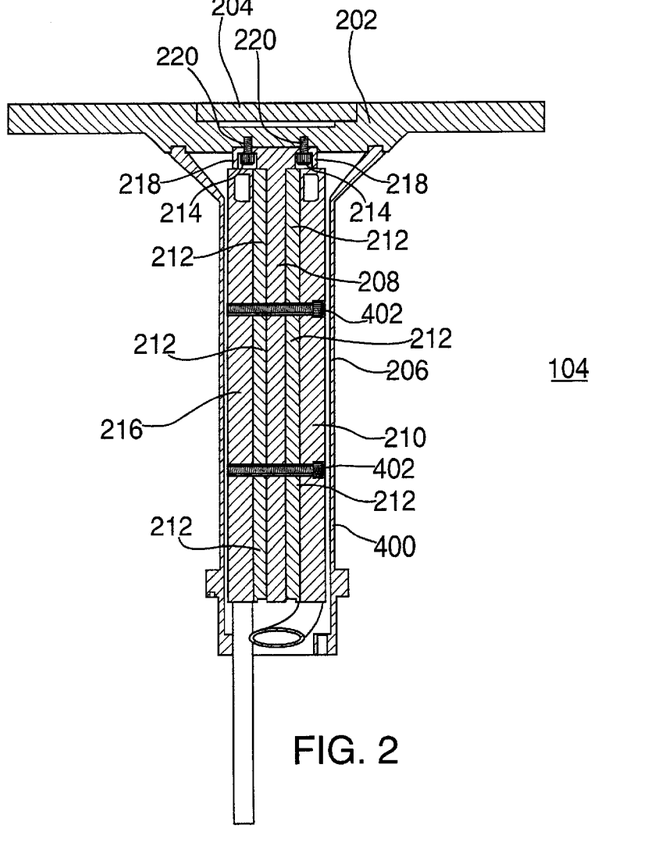
FIG. 2 is a cross-sectional view of a thermo-electric pedestal assembly.

FIG. 2 depicts a cross-sectional view of the pedestal assembly 104. The pedestal assembly 104 has a wafer support platen 202, a shaft 206, a stem 208, two water jackets 210 and 216, and at least one thermo-electric device 212. The platen 202, seen in greater detail in FIG. 3, has a platen body 320 and a plug 204. The platen body 320 is dish shaped, having a wafer support side 302, and a protruding surface 304 on a second side 316 opposite the wafer support side 302. The wafer support side 302 contains a centrally located stepped bore 306. The plug 204 is inserted into the stepped bore 306 so that the plug 204 rests upon a step 314. The plug 204 is welded to the platen body 320, forming a void or air gap 318 between a bottom surface 322 of the plug 204 and a bottom surface 324 of the stepped bore 306.

Figure 7:
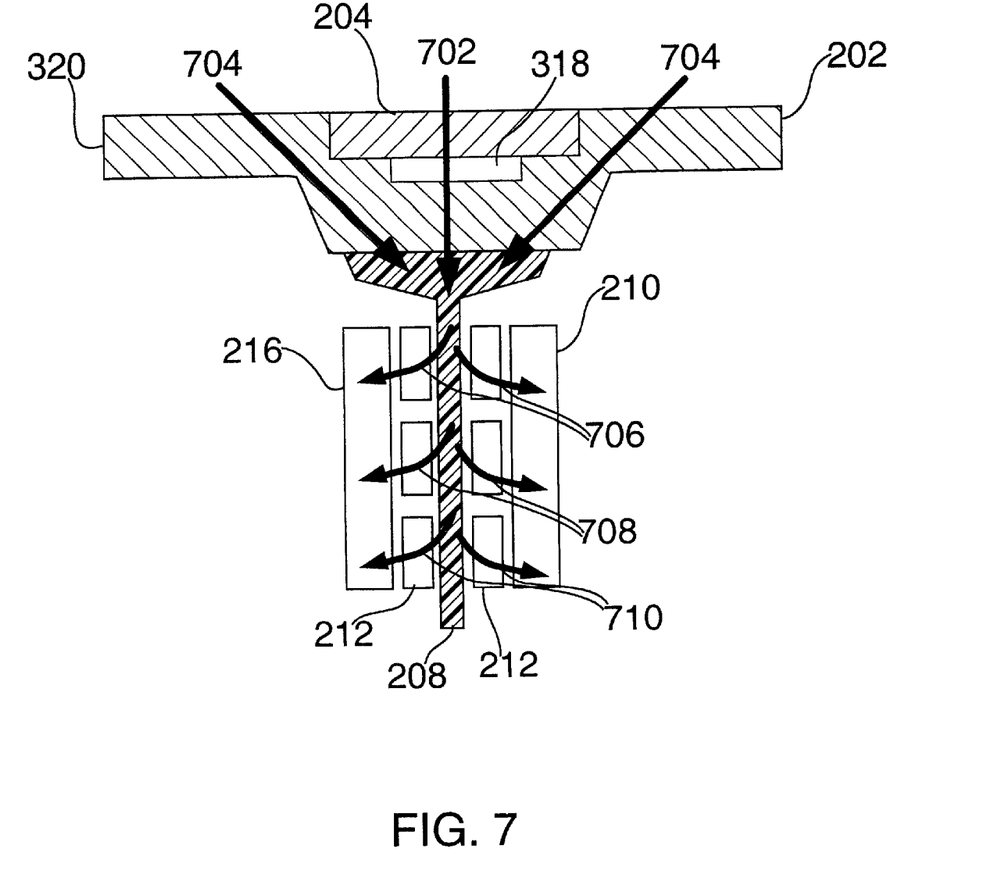
FIG. 7 is a cross-sectional schematic view of the thermal control assembly and the wafer support platen.

As illustrated in FIG. 7, the air gap 318 effectively creates an insulator in a thermal path 702 servicing the center of the platen 202 while allowing a more thermally conductive path 704 to service the perimeter of the platen 202. This dichotomy of thermal paths effectively creates a uniform temperature at the wafer support surface 120 of the platen 202. Although the air gap 318 is created using a plug 204 to fill a portion of a bore, any configuration of the platen 202 which creates a dichotomy of thermal paths controlling the temperature of a wafer support surface, each path having a different thermal conductivity achieved by the introduction of a void or material with a different coefficient of conductivity in one pathway will achieve the inventive effect. Optionally a solid platen (e.g., without an air gap) may be used in applications where temperature uniformity is not critical.

Figure 3:
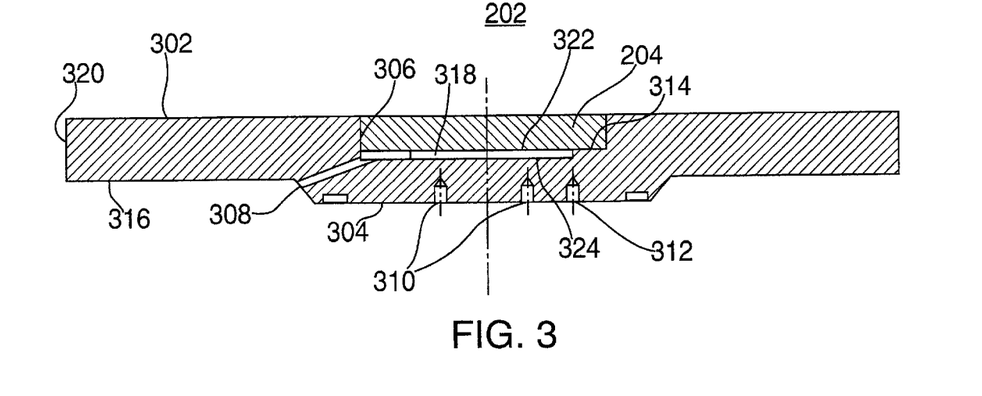
FIG. 3 is a cross-sectional view of a wafer support platen.

Referring to FIG. 3, a vent 308 provides a passage between the second side 316 and the air gap 318. This vent 308 ensures that the gap 318 atmosphere is at the same pressure as the atmosphere below the second side 316 of the platen body 320. The protruding surface 304 provides an attachment point to the shaft (see FIG. 2) and additionally contains blind threaded holes 310 and 312 for the mounting of the stem and sensors (seen in FIGS. 2 and 1, respectively).

Referring to FIG. 2, the protruding surface 304 provides an attachment point for the stem 208 and the shaft 206. The stem 208, which may be made of copper, is attached to the platen 202 by a plurality of bolts 214. Specifically, an upper portion 218 of the stem 208 transitions into a T-shaped flange. The bolts 214 communicate with openings 220 in the upper portion 218 and ultimately with the platen 202. The upper portion 218 of the stem 208 need not be T-shaped, but any other shape that facilitates attachment including but not limited to L-shaped, U-shaped or angled (i.e., at a 45° angle with respect to the stem 208. Additionally, other fasteners or fastening methods may be used, preferably methods that enhance thermal conductivity between the stem 208 and platen 202 such as brazing. It should be noted that the orientation of the stem 208 is centrally perpendicular to the platen 202. This is for illustration only and depicts but one possible orientation of the stem 208 to the platen 202. The stem 208 may be located off center and/or at an angle other than perpendicular to the platen 202 while providing the utility of the invention. The preferred orientation and location of the stem 208 to the platen 202 will be predicated upon the process chamber's (102 in FIG. 1) design and spatial requirements. The shaft 206 is attached, for example by brazing, welding, using adhesives, screwing and the like, at the outer perimeter of the protruding surface. Attached to the stem 208 is at least one thermo-electric device 212. In the illustrative embodiment, a plurality of thermo-electric devices 212 are shown, e.g., six. One such thermo-electric device is a Peltier device model number DT12-4 available from Marlow Industries. Each such device 212 is capable of transferring ("pumping") a particular amount of heat. As such, by using a plurality of thermo-electric devices 212, more heat can be transferred from/to the stem 208.

The thermo-electric devices 212 are coupled to the controller 114 (see FIG. 1). Between the thermo-electric devices 212 and the shaft 206 are a first and second water jacket 210 and 216. The water jackets 210 and 216 provide a heat sink/source for the thermo-electric devices 212 depending on whether the signal from the controller 114 causes the thermo-electric devices 212 to "pump" heat to or from the stem 208. The water jackets 210 and 216 may be replaced by a single or additional water jackets as needed providing the ability to provide a heat sink for the thermo-electric devices 212 remains adequate.

Figure 4:
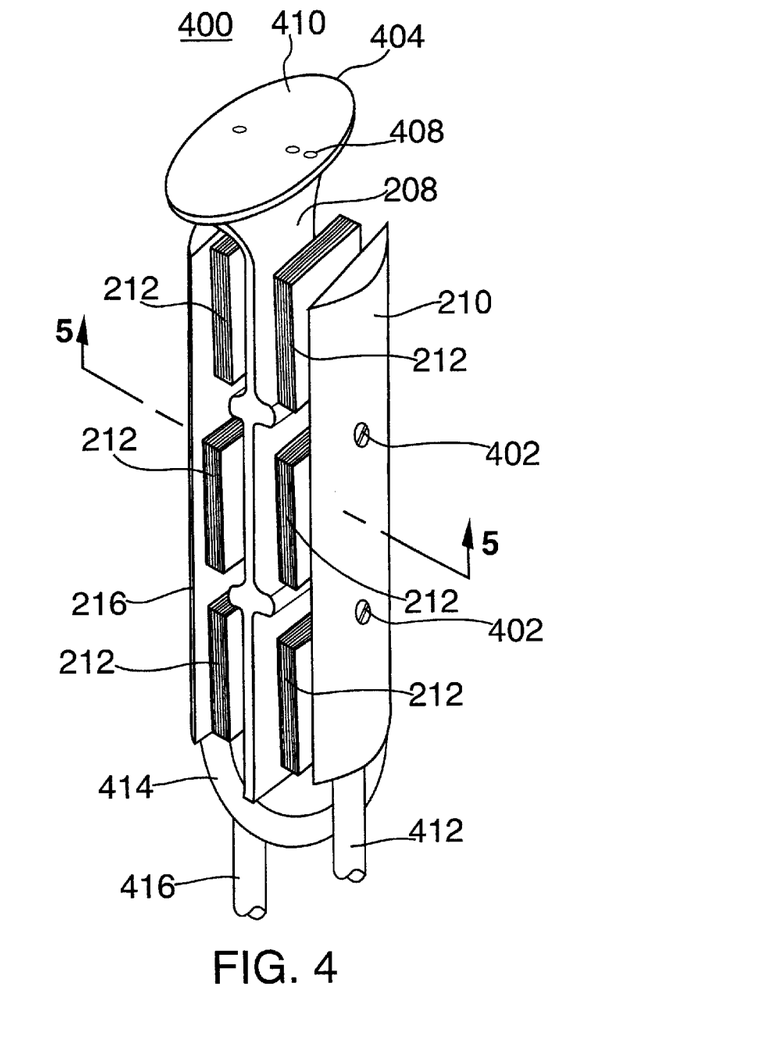
FIG. 4 is perspective view of a thermal control assembly.
Figure 5:
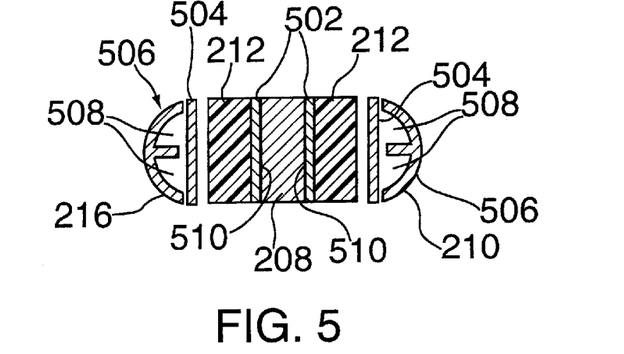
FIG. 5 is a cross-sectional view of the thermal control assembly of FIG. 4 along section lines 5—5.

The thermal control assembly 400 is best understood by referring to FIG. 4 and FIG. 5 simultaneously. FIG. 4 depicts a perspective view of the stem 208, the plurality of thermo-electric devices 212, and the first and second water jackets 210 and 216. First and second water jacket jackets 210 and 216 are held together by a plurality of fasteners 402 which pass through the first water jacket 210, the stem 208, and into the second water jacket 216. The fasteners 402 are additionally illustrated in FIG. 2 for clarity. A water jacket feed 412 is connected to the first water jacket 210. A water jacket outlet 416 is connected to the second water jacket 216. The first and second water jackets 210 and 216 are fluidly connected by a link 414.

Referring to the cross sectional view in FIG. 5, the stem 208 is substantially rectangular in cross-section. The thermo-electric devices 212 are fastened to the long sides 510 of the stem 208 using an adhesive 502. Adhesives which promote heat transfer between the stem 208 and the thermo-electric devices 212 are preferred and are well-known in the art. Sandwiching the stem 208 and the thermo-electric devices 212 are the first and second water jackets 210 and 216. Each water jacket has a jacket cover 504 and a jacket body 506 that defines a water passage 508.

Figure 6:
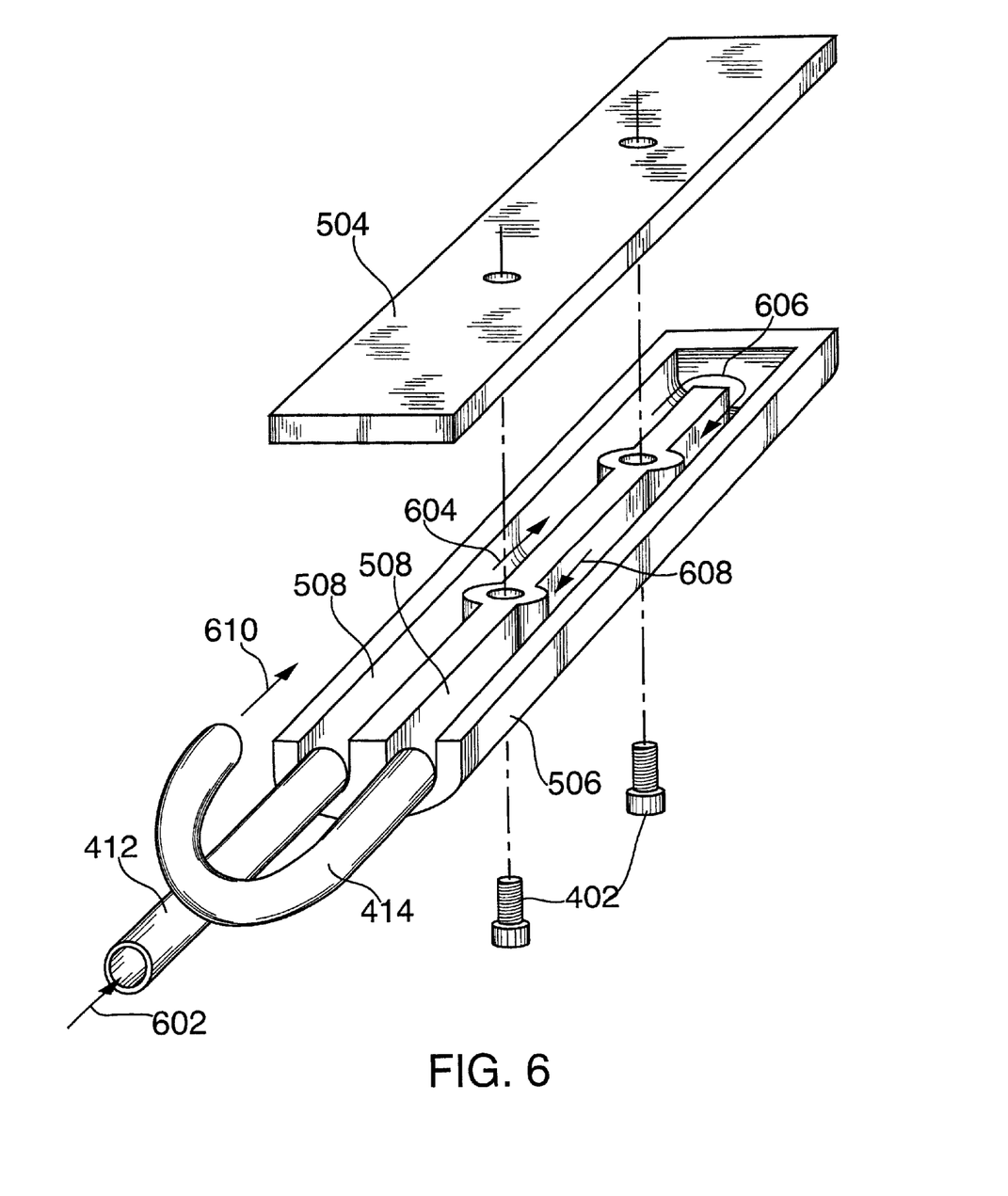
FIG. 6 is an exploded schematic view of the water jacket of the pedestal assembly of FIG. 2.

Facility's water (or other heat transfer medium) flowing through the water jackets 210 and 216 is depicted in FIG. 6 using an exploded view of the first water jacket 210. Arrows 602, 604, 606, 608 and 610 illustrate the direction of the flow of the heat transfer medium though the water jacket feed 412, into the water passages 508 of the first water jacket 210, into the link 414, and into the passages 508 of the second water jacket 216. The heat transfer medium similarly flows through second water jacket 216 until exiting via the water jacket output 416.

As the apparatus 100 of FIG. 1 may be configured to perform a variety of processes, operation of the invention performing Chemical Vapor Deposition (CVD) is presented as an illustration for the use of the invention. In operation, a wafer 108 is placed upon the wafer support side 302 of the platen 202. A vacuum is established in the chamber 102. The chamber walls 118 are substantially maintained at 65° Celsius by running a coolant from a reservoir 112 through passages 122 in the chamber walls 118. The temperature of the coolant is controlled at the reservoir 112.

The wafer 108 is lowered to below room temperature by drawing heat from the wafer 108 into the platen 202. Heat is drawn from the platen 202 and into the stem 208 by supplying a control signal to the thermo-electric devices 212 that "pump" the heat from the stem 208 into the first and second water jackets 210 and 216 (see arrows 702, 704, 706, 708 and 710 of FIG. 7). Circulating facility's water within the water jackets 210 and 216 provides a heat sink for the invention. The rate of heat "pumping" is determined by the controller 114 in response to information provided by the sensor 116.

Once the wafer is at the desired process temperature, the gas supply 110 furnishes the reactant gas through the showerhead 106 to the process chamber 102. For example, if a low dielectric constant material (low k material such as BLACK DIAMOND™ having a value of approximately 2.4–3.0) is to be deposited on the wafer, the platen is maintained at between 15 and 18° C. with a temperature variation across the platen of no more than ±1.5° C. BLACK DIAMOND™ is a trademark of Applied Materials, Inc. of Santa Clara, Calif. Upon termination of the process, the reactant gas and any process byproducts are evacuated from the chamber 102.

To facilitate further processing within the chamber 102, periodic cleaning is performed within the chamber 102. During cleaning, the polarity of the signal from the controller 114 to the thermo-electrical devices 212 may be reversed and heated water flow through the water jackets 210 and 216. This causes heat to be "pumped" into the platen 202 via the stem 208. The elevated temperature of the platen 202 allows for a faster and more effective cleaning process.

Figure 8:
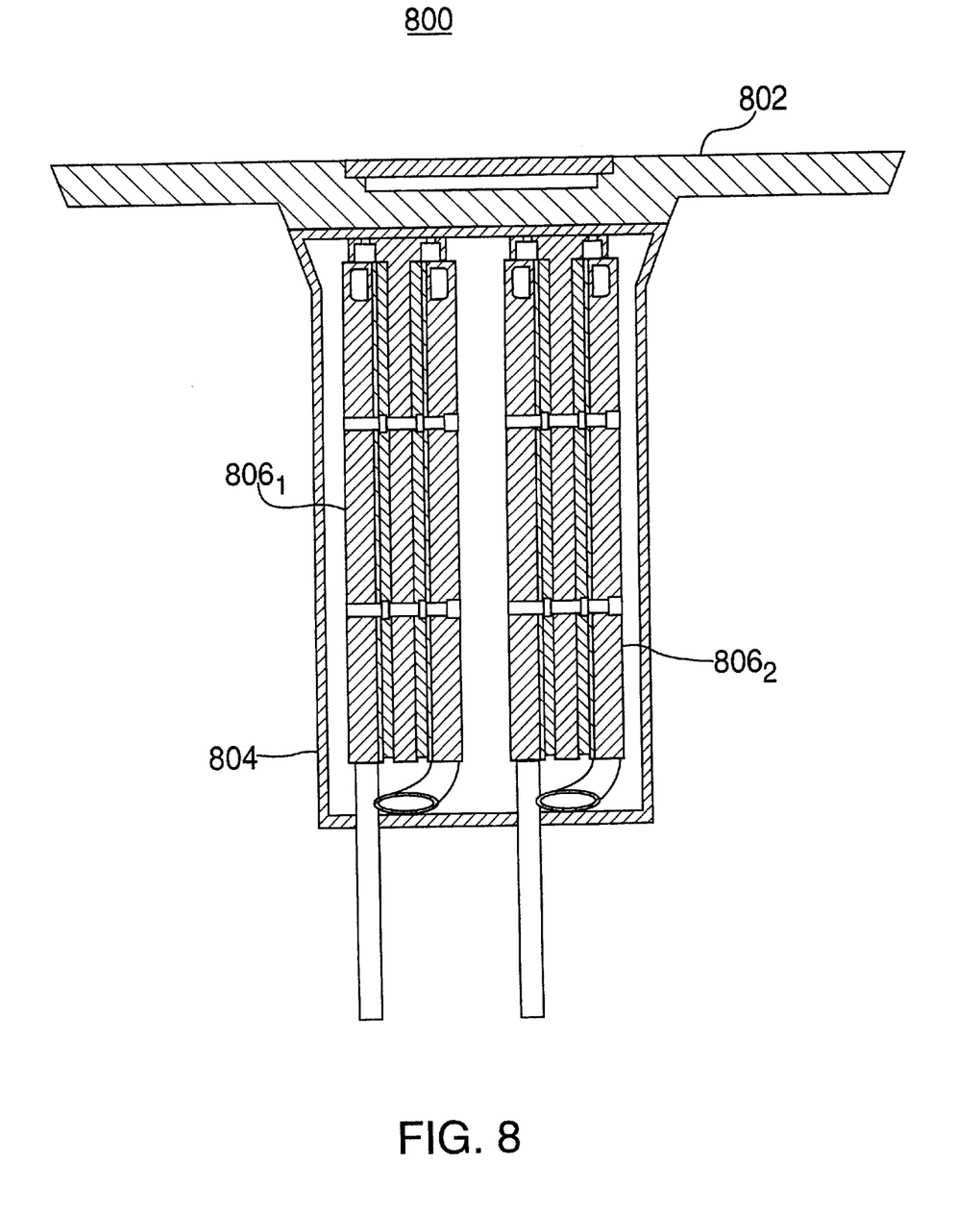
FIG. 8 is a cross-sectional schematic view of a second embodiment of a thermo-electric pedestal assembly.

A second embodiment of the invention is depicted in FIG. 8. A thermo-electric pedestal 800 has a platen 802, a shaft 804 and a plurality (i.e., two) thermo-electric devices $806_n$ attached to the platen 802. Additional thermo-electric devices may also be employed as necessary to obtain the desired temperature control characteristics of the platen 802. The shaft 804 is attached to the platen 802 and additionally encases the thermo-electric devices $806_n$. A plurality of shafts may also be utilized as to encase each thermo-electric device individually.

Although the embodiment of the invention which incorporate the teachings of the present invention which has been shown and described in detail herein, those skilled in the art can readily devise other varied embodiments which still incorporate the teachings and do not depart from the spirit of the invention.

What is claimed is:

1. Apparatus for controlling the temperature of a workpiece comprising:
    a platen body having a workpiece support surface;
    a plug centrally disposed in a bore formed in the workpiece support surface, the plug having a first surface co-planar to the workpiece support surface and a lower surface opposite the first surface, wherein the plug and platen body have different rates of thermal conductivity; and
    a void defined between the lower surface of the plug and a bottom of the bore.

2. The apparatus of claim 1, wherein the platen body further comprises a vent disposed therein, the vent fluidly coupling the void with an exterior of said platen body.

3. The apparatus of claim 1, wherein the plug rests on a step formed in the bore disposed in the platen body.

4. The apparatus of claim 1, wherein the plug is welded to the platen body.

5. The apparatus of ciaim 1, further comprising a thermal control assembly coupled to a side of the platen body opposite the workpiece support surface.

6. The apparatus of claim 1, further comprising:
    a thermal control assembly coupled to a bottom of the platen body, wherein the thermal control assembly comprises:
        at least one thermo-eletric device; and
        at least one jacket adapted to carry a heat transfer fluid adjacent the thermo-electric device.

7. Apparatus for controlling the temperature of a workpiece comprising:
    a first portion having a thermal conductivity and a workpiece support surface; and
    a second portion centrally disposed in the workpiece support surface, the second portion having a first surface co-planar to the workpiece support surface and a second surface opposite the first surface, wherein a gap is formed between the second surface of the second portion and the first portion, the second portion having a thermal conductivity different than the thermal conductivity of the first portion.

8. The apparatus of claim 7, wherein the thermal conductivity of the first portion is higher than the thermal conductivity of the second portion.

9. Apparatus for controlling the temperature of a workpiece comprising:
    a platen body having a first surface and a second surface opposite the first surface;
    a plug centrally disposed in a bore formed in the first surface, the plug having a first side coplanar with the first surface and a second side opposite the first side, wherein the plug and platen body have different rates of thermal conductivity and wherein a void is defined between second side the plug and a bottom of the bore disposed in the platen body;
    a workpiece support surface for supporting the workpiece defined by the first surface of the platen body and the first side of the plug;
    a first thermal path disposed between the workpiece support surface and the second surface of the platen body, the first thermal path running between the first surface of the platen body and the second surface of the platen body; and
    a second thermal path disposed between the workpiece support surface and the second surface of the platen body, the second thermal path running between the first side of the plug and the second surface of the platen body, the second thermal path at least partially including the void.

10. A semiconductor wafer processing system comprising:
    a process chamber having a base, walls and lid, said walls having internal passages;
    a gas supply connected to said process chamber;
    a coolant reservoir fluidly connected to said internal passages;
    a showerhead centrally disposed beneath said lid, fluidly connected to said gas supply;
    a platen disposed within said process chamber, the platen comprising:

a platen body having a workpiece support surface;
a plug centrally disposed in a bore formed in the workpiece support surface, the plug having a first surface co-planar to the workpiece support surface and a lower surface opposite the first surface, wherein the plug and platen body have different rates of thermal conductivity; and
a void defined between the lower surface of the plug and a bottom of the bore.

11. The apparatus of claim 10, wherein the platen body further comprises a vent disposed therein, the vent fluidly coupling the void with an exterior said platen body.

12. The apparatus of claim 10, wherein the plug rests on a step formed in the bore disposed in the platen body.

13. The apparatus of claim 10, wherein the plug is welded to the platen body.

14. The apparatus of claim 10, further comprising a thermal control assembly coupled to a side of the platen body opposite the workpiece support surface.

15. The apparatus of claim 14, wherein the thermal control assembly comprises:
at least one thermo-electric device; and
at least one jacket adapted to carry a heat transfer fluid adjacent the thermo-electric device.

16. A semiconductor wafer processing system comprising:
a process chamber having a base, walls and lid, said walls having internal passages;
a gas supply connected to said process chamber;
a coolant reservoir fluidly connected to said internal passages;
a showerhead centrally disposed beneath said lid, fluidly connected to said gas supply; and
a platen disposed within said process chamber, the platen comprising:
a first portion having a thermal conductivity and a workpiece support surface; and
a second portion centrally disposed in the workpiece support surface, the second portion having a first surface co-planar to the workpiece support surface and a second surface opposite the first surface, wherein a gap is formed between the second surface of the second portion and the first portion, the second portion having a thermal conductivity different than the thermal conductivity of the first portion.

17. The apparatus of claim 16, wherein the thermal conductivity of the first portion is higher than the thermal conductivity of the second portion.

18. A semiconductor wafer processing system comprising:
a process chamber having a base, walls and lid, said walls having internal passages;
a gas supply connected to said process chamber,
a coolant reservoir fluidly connected to said internal passages;
a showerhead centrally disposed beneath said lid, fluidly connected to said gas supply; and
a platen disposed within said process chamber, the platen comprising:
a platen body having a first surface and a second surface opposite the first surface;
a plug centrally disposed in a bore formed in the first surface, the plug having a first side coplanar with the first surface and a second side opposite the first side, wherein the plug and platen body have different rates of thermal conductivity and wherein a void is defined between second side the plug and a bottom of the bore disposed in the platen body;
a workpiece support surface for supporting the workpiece defined by the first surface of the platen body and the first side of the plug;
a first thermal path disposed between the workpiece support surface and the second surface of the platen body, the first thermal path running between the first surface of the platen body and the second surface of the platen body; and
a second thermal path disposed between the workpiece support surface and the second surface of the platen body, the second thermal path running between the first side of the plug and the second surface of the platen body, the second thermal path at least partially including the void.

19. A semiconductor wafer processing system comprising:
a process chamber having a base, walls and lid, said walls having internal passages;
a gas supply connected to said process chamber;
a coolant reservoir fluidly connected to said internal passages;
a showerhead centrally disposed beneath said lid, fluidly connected to said gas supply;
a platen disposed within said process chamber, the platen comprising:
a platen body having a first surface and a second surface opposite the first surface;
a plug centrally disposed in a bore formed in the first surface, the plug having a first side coplanar with the first surface and a second side opposite the first side, the plug and platen body having different rates of thermal conductivity, wherein a void is defined between second side of the plug and a bottom of the bore disposed in the platen body;
a workpiece support surface for supporting the workpiece defined by the first surface of the platen body and the first side of the plug;
a first thermal path disposed between the workpiece support surface and the second surface of the platen body, the first thermal path running between the first surface of the platen body and the second surface of the platen body; and
a second thermal path disposed between the workpiece support surface and the second surface of the platen body, the second thermal path running between the first side of the plug and the second surface of the platen body, the second thermal path at least partially including the void.

20. Apparatus for controlling the temperature of a workpiece comprising:
a workpiece support surface;
a first means for transferring heat at a first rate having at least a portion disposed co-planar to the workpiece support surface;
a second means for transferring heat at a second rate different than the first rate having at least a portion disposed co-planar to the workpiece support surface, a plug centrally disposed in the platen body and having a different rate of thermal conductivity than the platen body; and a third means for transferring heat at a third rate different than the first and second rates, the third means disposed between the first and second heat transferring means, wherein the third means comprises a gap defined between the plug and platen body.

21. The apparatus of claim 20, wherein the first rate is faster than the second rate.

22. The apparatus of claim 20, wherein the first means comprises at least a portion of a platen body.

23. The apparatus of claim 20, wherein the third means comprises a gap disposed between the plug and the platen body.

* * * * *